US007406756B2

(12) United States Patent
Umetsu et al.

(10) Patent No.: US 7,406,756 B2
(45) Date of Patent: Aug. 5, 2008

(54) METHOD FOR MANUFACTURING A PIEZOELECTRIC RESONATOR

(75) Inventors: Kazushige Umetsu, Chino (JP); Kazuto Yoshimura, Suwa (JP); Tsukasa Funasaka, Shiojirishi (JP); Fumitaka Kitamura, Suwa (JP)

(73) Assignee: Seiko Epson Corporation (JP)

( * ) Notice: Subject to any disclaimer, the term of this patent is extended or adjusted under 35 U.S.C. 154(b) by 433 days.

(21) Appl. No.: 10/970,696

(22) Filed: Oct. 21, 2004

(65) Prior Publication Data

US 2005/0115038 A1 Jun. 2, 2005

(30) Foreign Application Priority Data

Oct. 22, 2003 (JP) ............................ 2003-362005

(51) Int. Cl.
*H01L 41/22* (2006.01)
*B23K 26/00* (2006.01)

(52) U.S. Cl. .......................... 29/25.35; 29/830; 29/831; 29/832; 29/846; 219/121.68

(58) Field of Classification Search ................ 29/25.35, 29/830, 831, 832, 846, 840, 603; 310/311, 310/335, 313 A, 313 B; 219/121.68, 121.84, 219/121.85, 121.1; 216/47, 66, 62; 428/463, 428/570
See application file for complete search history.

(56) References Cited

U.S. PATENT DOCUMENTS

| | | | | | |
|---|---|---|---|---|---|
| 4,186,480 | A | * | 2/1980 | Binder Kriegelstein et al. | 29/603.04 |
| 5,229,180 | A | * | 7/1993 | Littmann | 428/43 |
| 5,809,000 | A | * | 9/1998 | Choi | 369/112.05 |
| 5,952,668 | A | * | 9/1999 | Baer | 250/492.2 |
| 5,958,268 | A | * | 9/1999 | Engelsberg et al. | 219/121.84 |
| 5,986,807 | A | * | 11/1999 | Fork | 359/569 |
| 6,034,349 | A | * | 3/2000 | Ota | 219/121.73 |
| 6,048,588 | A | * | 4/2000 | Engelsberg | 427/554 |
| 6,133,986 | A | * | 10/2000 | Johnson | 355/67 |

FOREIGN PATENT DOCUMENTS

JP 08-181557 7/1996

(Continued)

OTHER PUBLICATIONS

Examination result issued in corresponding Japanese application.

(Continued)

*Primary Examiner*—A. Dexter Tugbang
*Assistant Examiner*—Tai Nguyen
(74) *Attorney, Agent, or Firm*—Harness, Dickey & Pierce, P.L.C.

(57) ABSTRACT

A method for manufacturing a piezoelectric resonator is provided including: forming a resonator element having a plate-like base and a plurality of arms extending laterally from the base on a substrate made of crystal; emitting laser light for irradiating one surface and the other surface of the arms with laser light and for removing a region irradiated with the laser light, so as to form a groove having a predetermined cross sectional shape perpendicular to the longitudinal direction of the groove; forming a driving electrode on the resonator element.

3 Claims, 17 Drawing Sheets

32
36
33
6
3
7
6
4
7
8
3
9
10
4
11

FOREIGN PATENT DOCUMENTS

| | | | |
|---|---|---|---|
| JP | 10-270813 A | | 10/1998 |
| JP | 2001-185987 | | 7/2001 |
| JP | 2001-296469 | * | 10/2001 |
| JP | 2002-076806 A | | 3/2002 |
| JP | 2002-169133 A | | 6/2002 |
| JP | 2003-290942 A | | 10/2003 |
| JP | 08-242134 | | 9/1996 |

OTHER PUBLICATIONS

Yangyuan, et al., “Development and Challenges of Lithography for ULSI”, Institute of Microelectronics, Peking University, 100871 China, (Chinese Journal of Semiconductors), vol. 23, No. 3, Mar. 2002 (pp. 225-237).

Liu, et al., “Application of litography technology in microelectronic manufacturing”, China Academic Journal Electronic Publishing House, Semiconductor Technology, vol. 26, No. 8, Aug. 2001 (pp. 37-39 and 48).

* cited by examiner

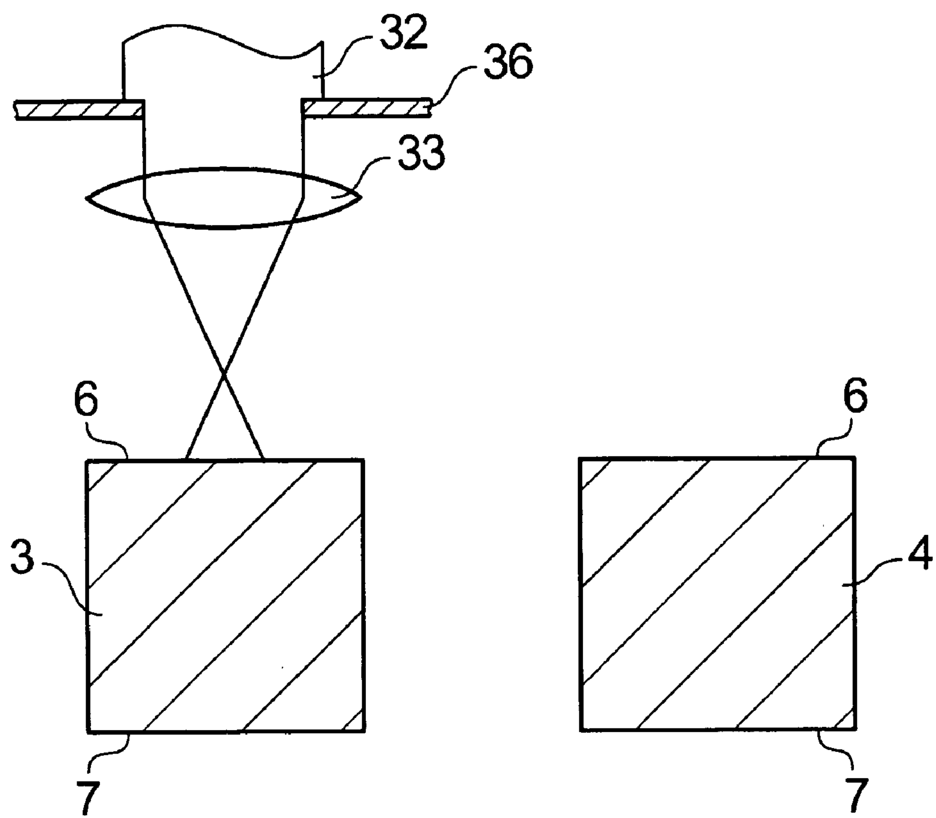
F I G. 3 (a)
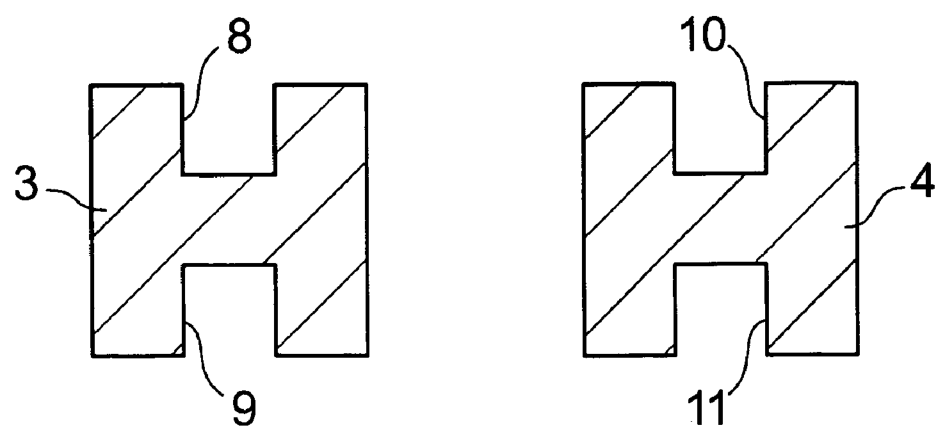
F I G. 3 (b)

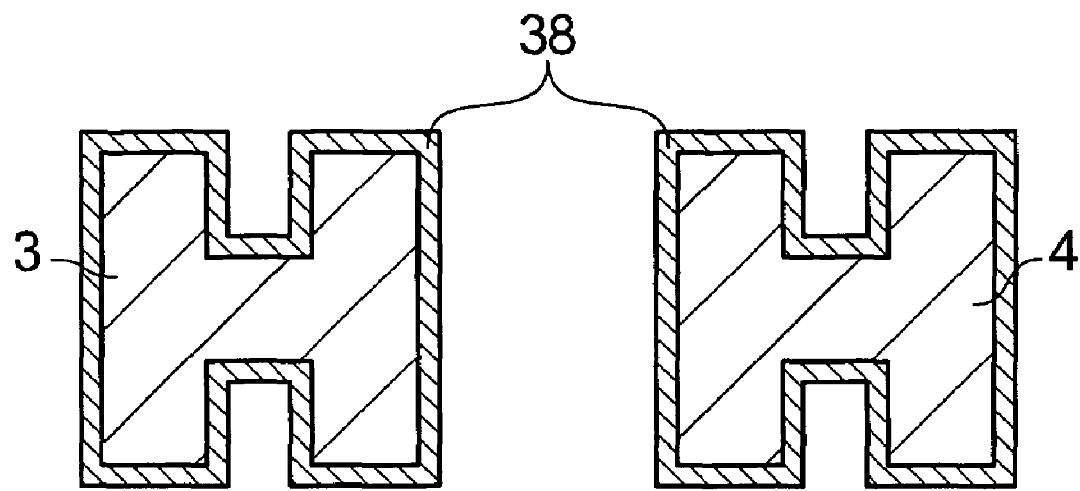
F I G. 4 (a)
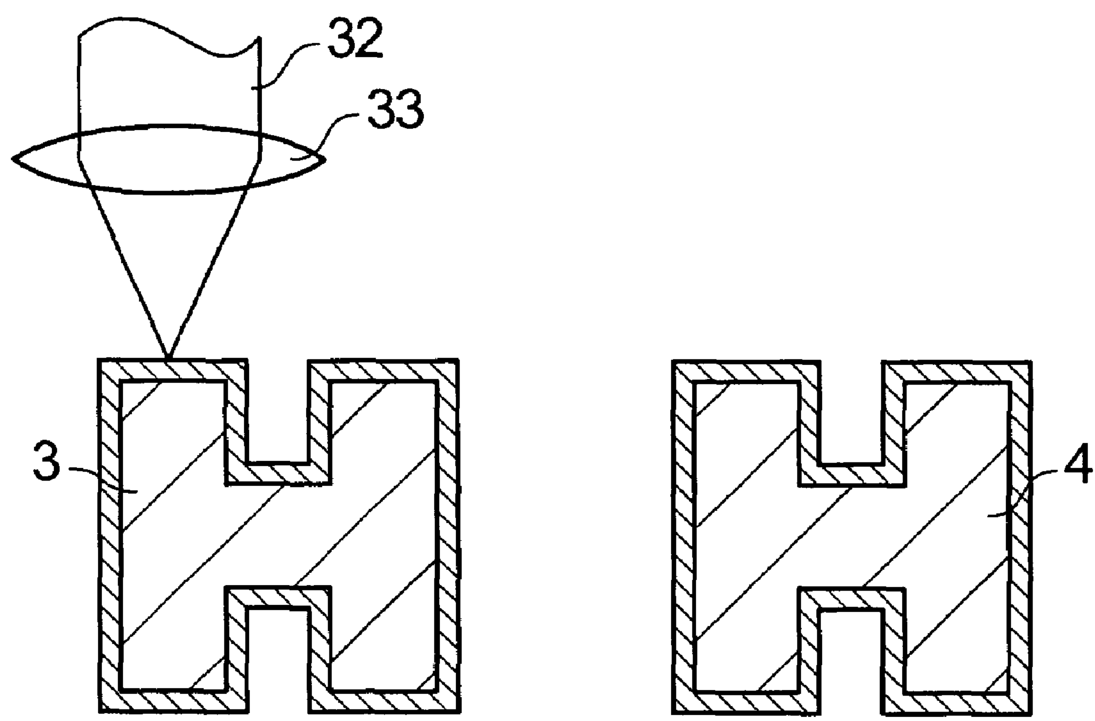
F I G. 4 (b)

F I G. 5
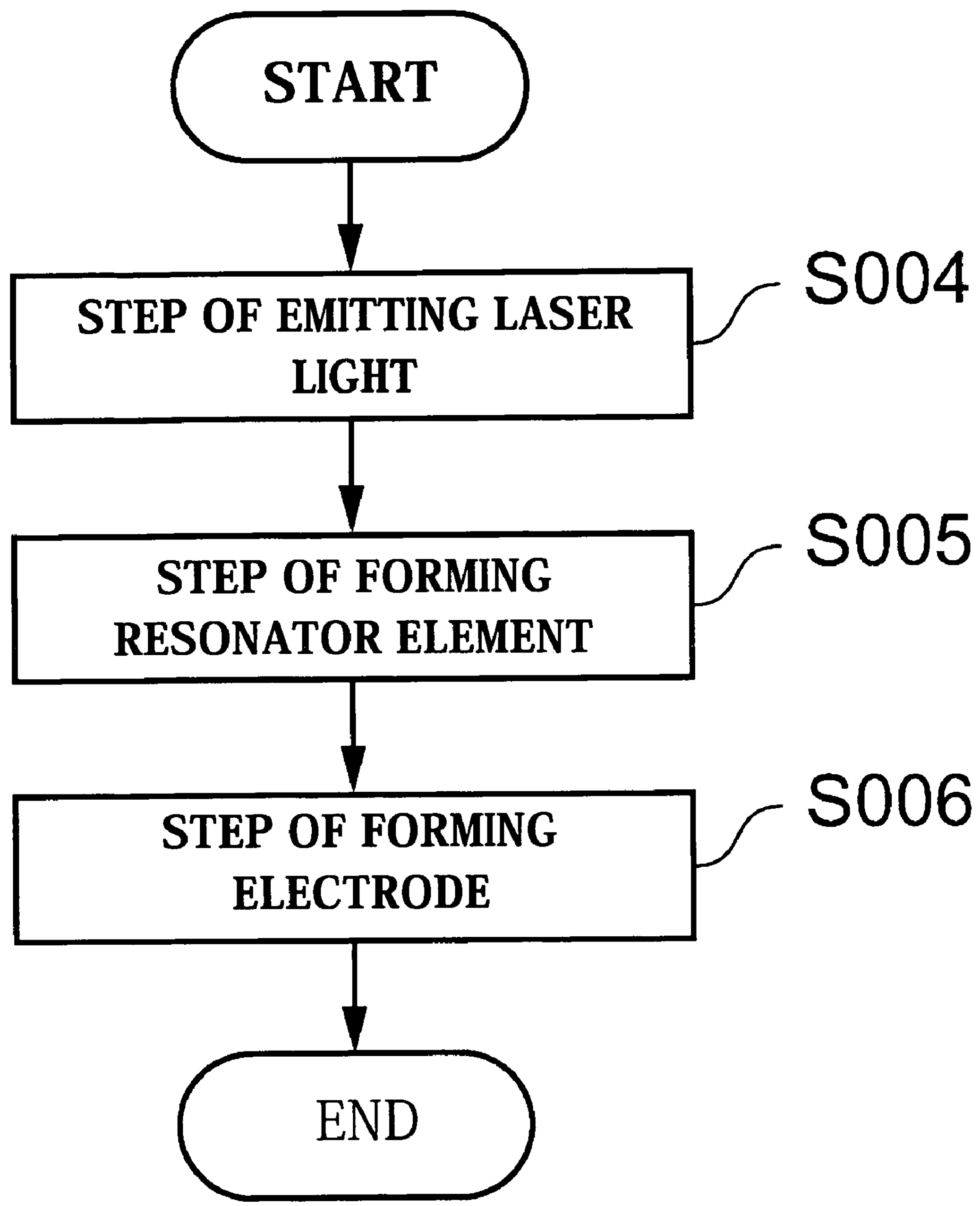

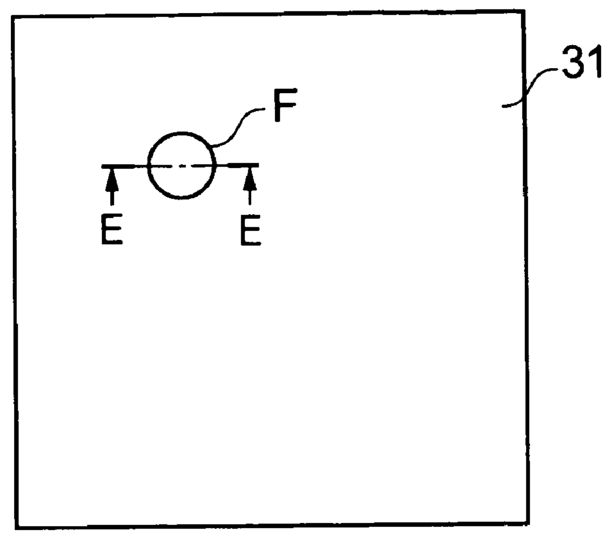
F I G. 6 (a)
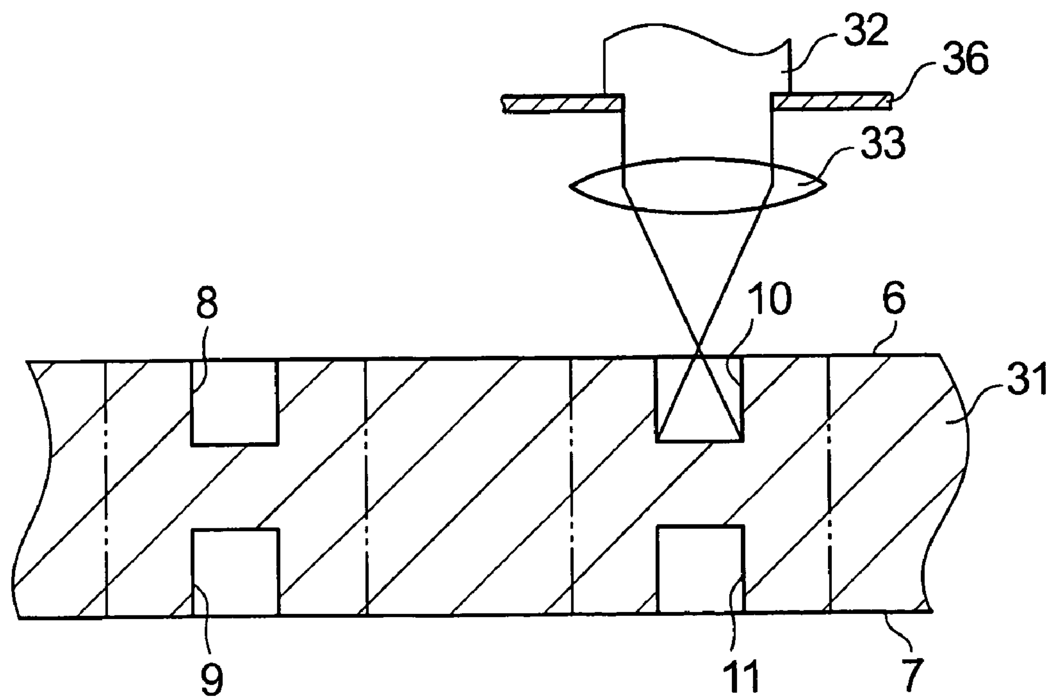
F I G. 6 (b)

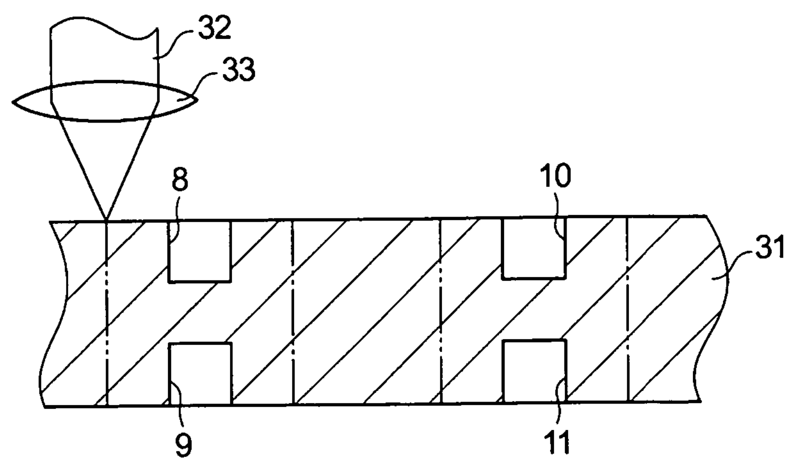
F I G. 7 (a)
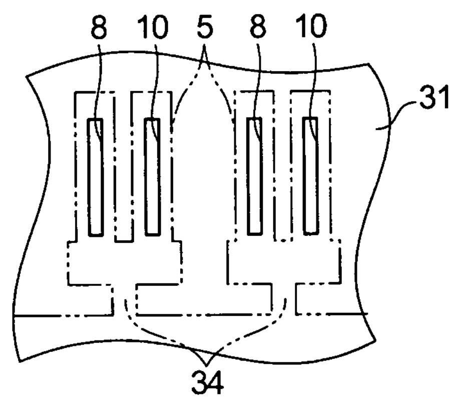
F I G. 7 (b)
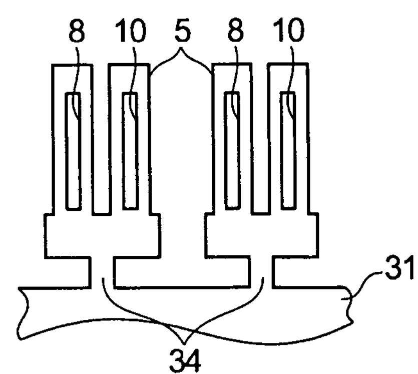
F I G. 7 (c)

F I G. 8
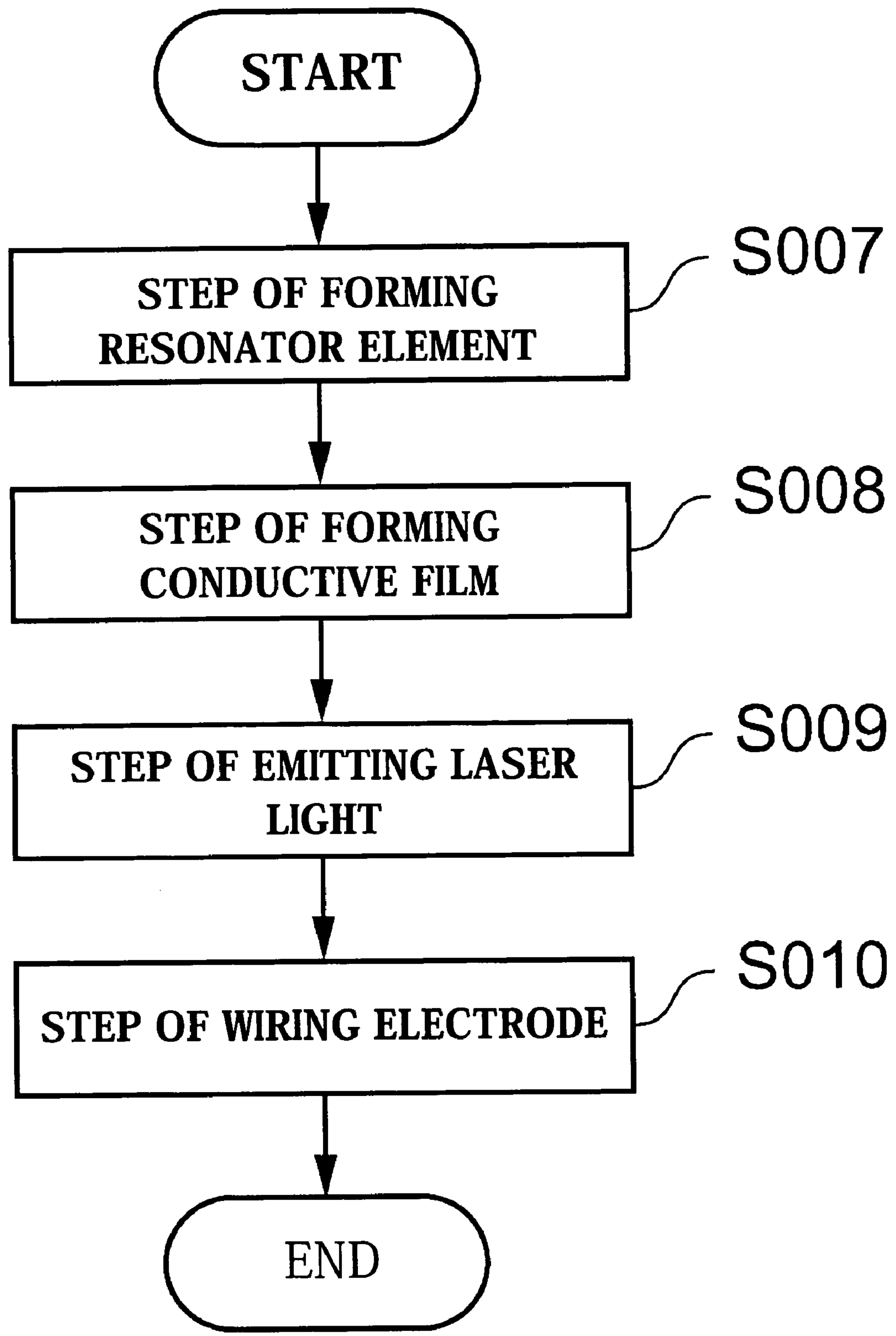

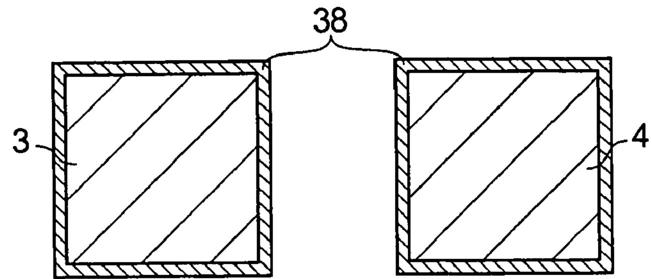
F I G. 9 (a)
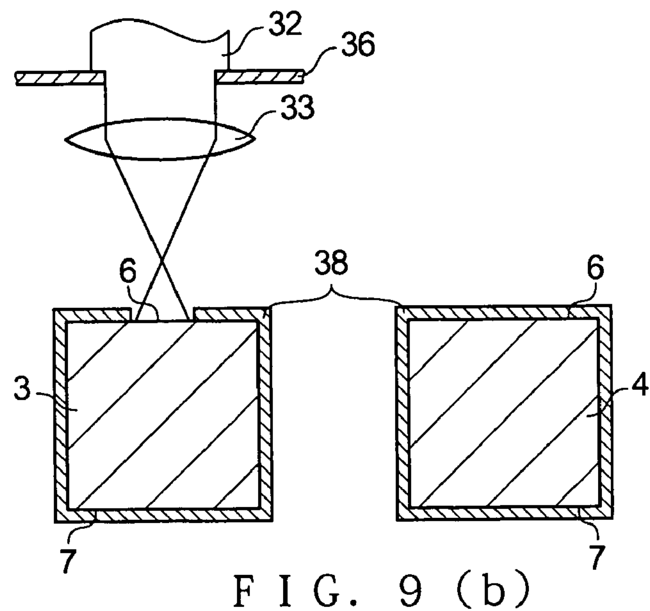
F I G. 9 (b)
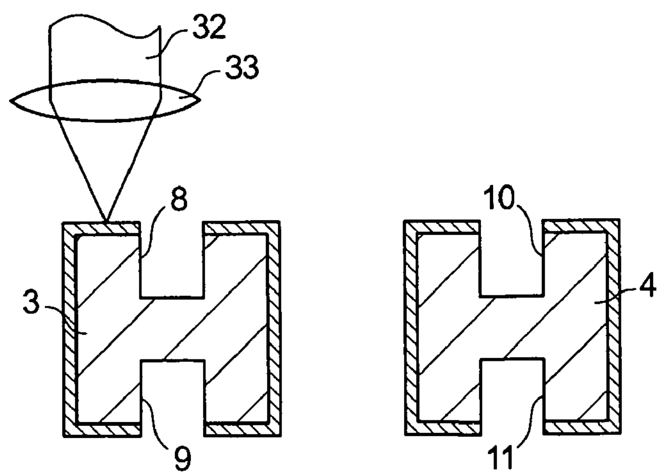
F I G. 9 (c)

START
STEP OF FORMING RESONATOR ELEMENT
S011
STEP OF FORMING CONDUCTIVE FILM
S012
STEP OF WIRING ELECTRODE
S013
STEP OF EMITTING LASER LIGHT
S014
END

F I G. 1 2
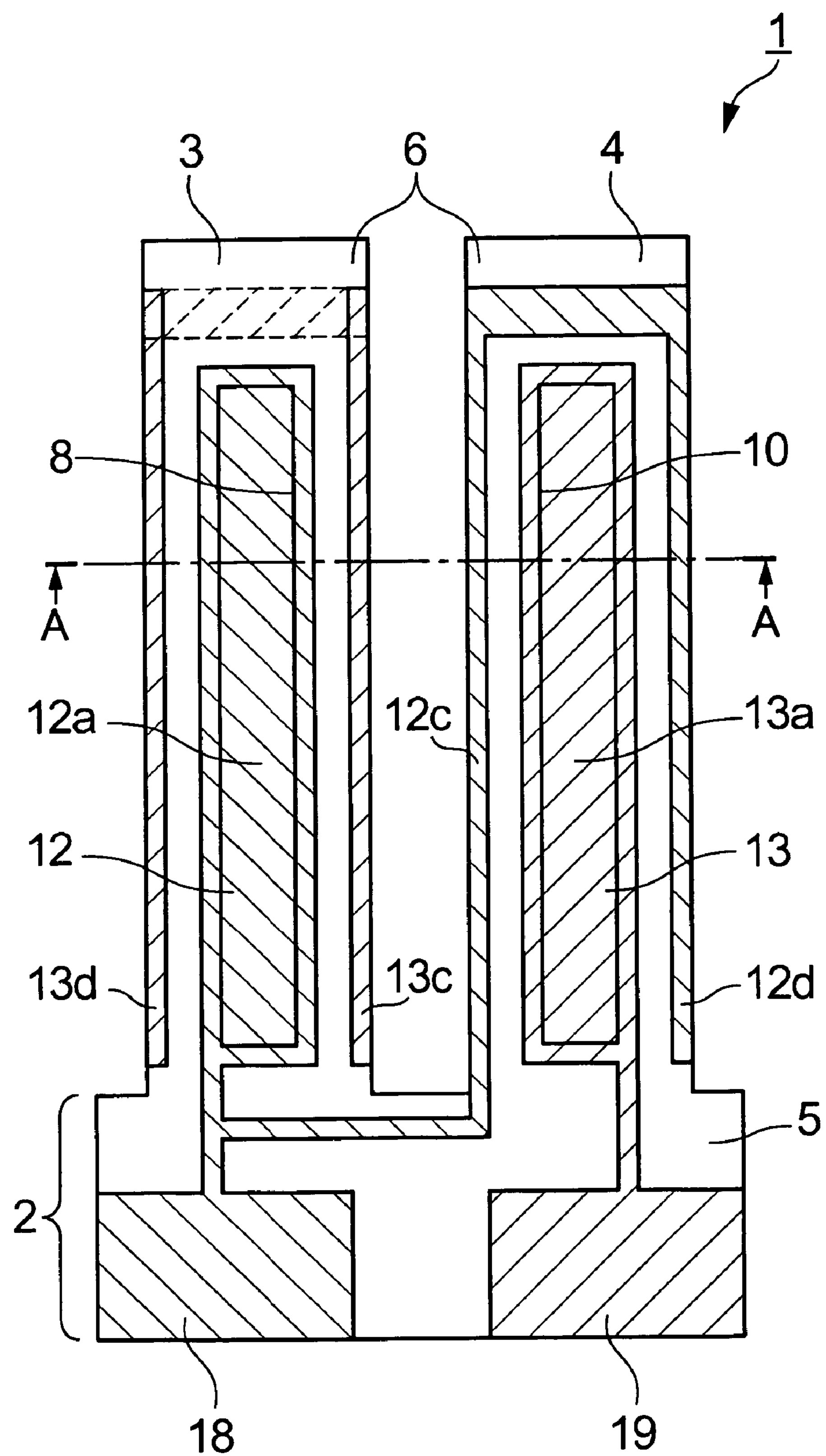

F I G. 1 3
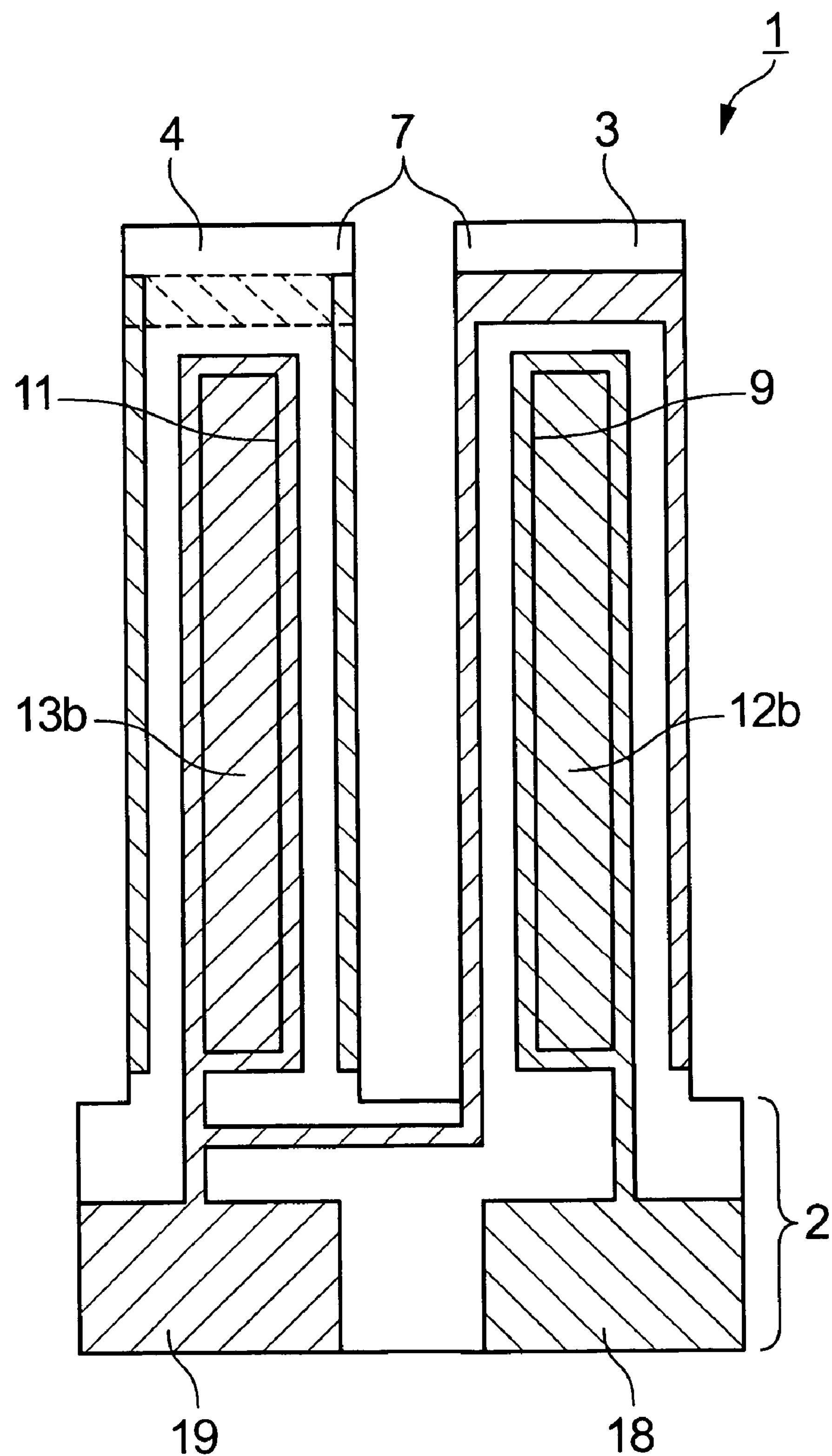

F I G. 1 4
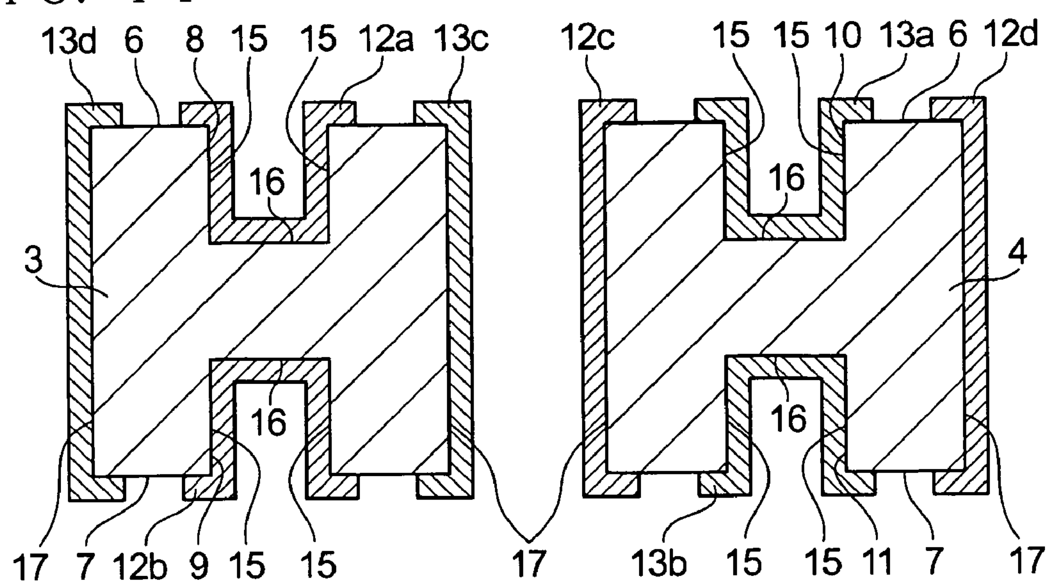

F I G. 1 5
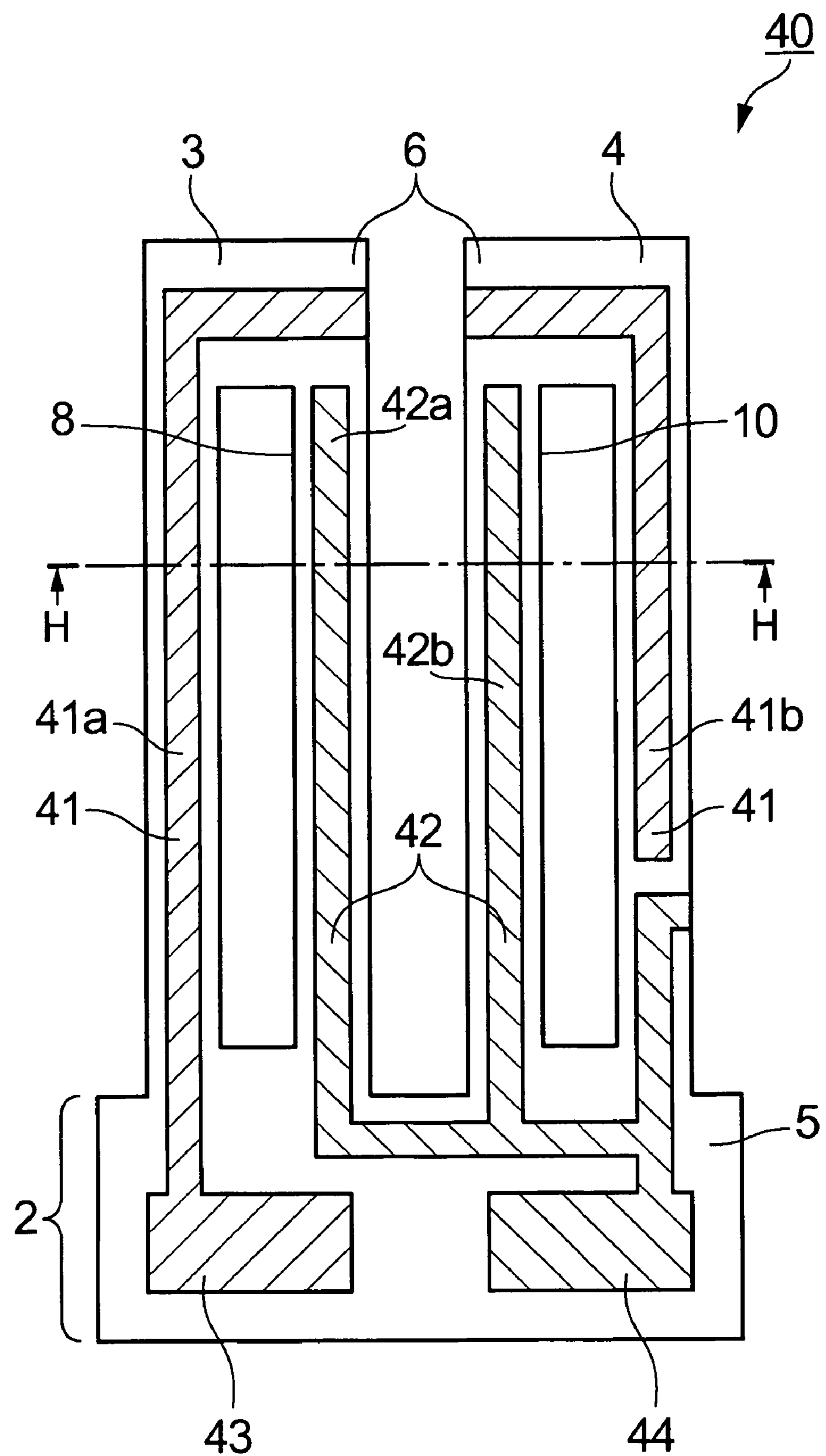

F I G. 1 6
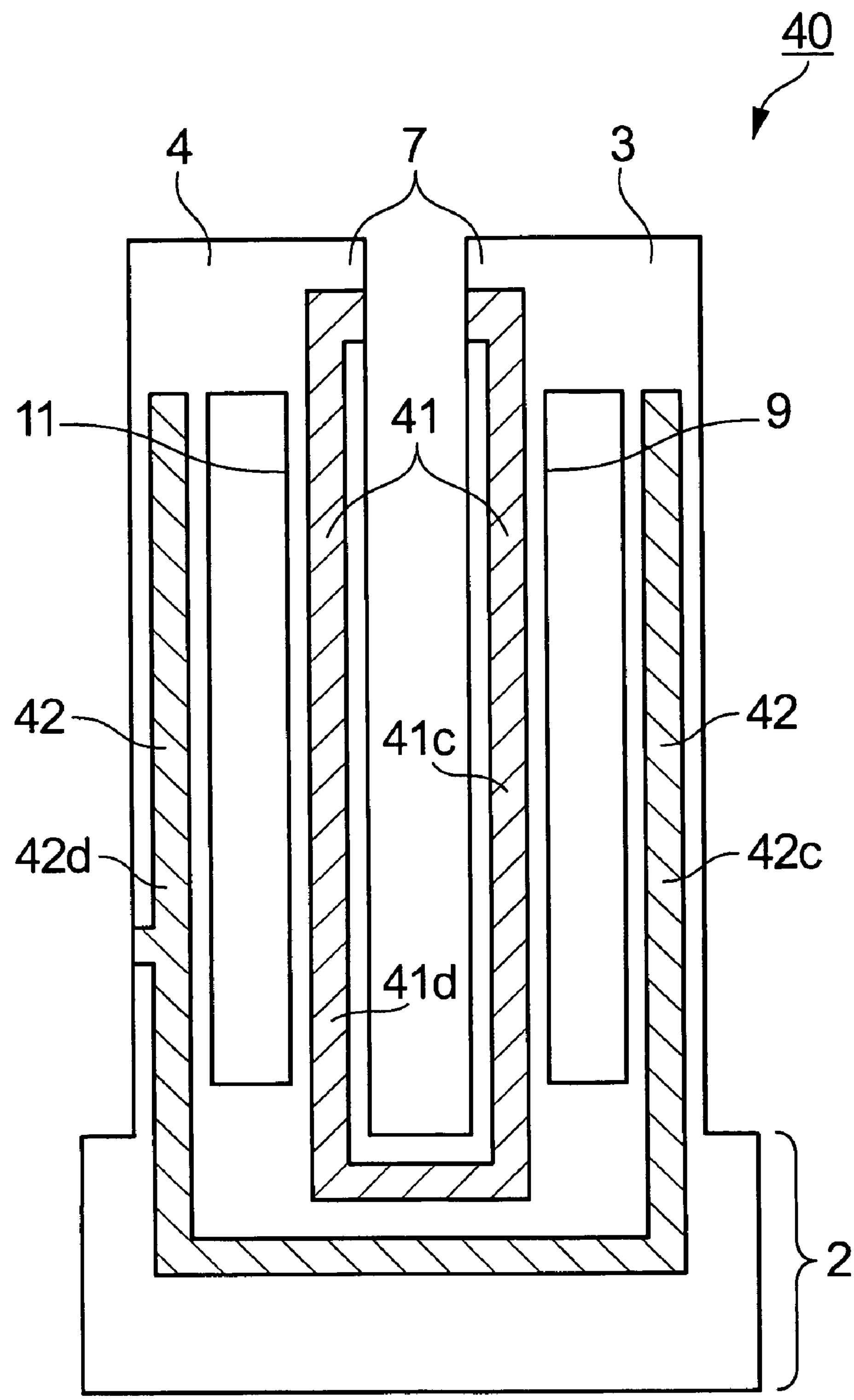

METHOD FOR MANUFACTURING A PIEZOELECTRIC RESONATOR

RELATED APPLICATIONS

This application claims priority to Japanese Patent Application No. 2003-362005 filed Oct. 22, 2003 which is hereby expressly incorporated by reference herein in its entirety.

BACKGROUND

1. Technical Field

The present invention relates to a method for manufacturing a piezoelectric resonator, and particularly to a method for manufacturing a piezoelectric resonator having a micro groove in its arm.

2. Related Art

As smaller configurations have been adopted for electronic devices in recent years, there is a need for smaller electronic parts embedded in these devices.

Conventionally, a groove is formed on the arm of a piezoelectric resonator so as to decrease crystal impedances as well as increasing electromechanical coupling factors in order to attain smaller configurations (see Japanese Unexamined Patent Publication No. 2001-185987, for example).

While etching can be used for forming a groove on the arm, it is known that a groove with a desired cross sectional shape is hard to form since crystal has an anisotropic structure. In order to solve this problem, dry etching methods have been proposed to attain a desired cross sectional shape (see Japanese Unexamined Patent Publication No. 8-242134, for example).

The conventional technique that is disclosed in Japanese Unexamined Patent Publication No. 8-242134, however, involves the problem of the slow pace of dry etching. Moreover, it is difficult to improve processing efficiency because of the number of photolithography steps prior to the dry etching process, which has yet to be solved.

In consideration of the above-mentioned problems, the present invention aims to provide a method for manufacturing a piezoelectric resonator that is capable of accurately forming a groove of a desired shape in simplified steps in a short period of time.

SUMMARY

In order to solve the above-mentioned problems, in one aspect the prevent invention, a method for manufacturing a piezoelectric resonator including a resonator element having a plate-like base and a plurality of arms extending laterally from the base, the arms being provided with a groove, includes:

emitting laser light for irradiating one surface and another surface of the arms with laser light and for removing a region irradiated with the laser light, so as to form the groove having a predetermined cross sectional shape perpendicular to a longitudinal direction of the groove.

This makes it possible to accurately form the groove having a desired shape in a short period of time by a simple step of emitting laser light.

In another aspect of the present invention, a method for manufacturing a piezoelectric resonator including a resonator element having a plate-like base and a plurality of arms extending laterally from the base, the arms being provided with a groove, includes:

forming at least one resonator element on a substrate made of a piezoelectric material with part of the resonator element coupled to the substrate;

irradiating one surface and another surface of the arms of the resonator element with laser light and removing a region irradiated with the laser light so as to form the groove having a predetermined cross sectional shape perpendicular to a longitudinal direction of the groove; and forming a driving electrode that provides the resonator element with a voltage for driving the piezoelectric resonator.

This makes it possible to accurately form the groove having a desired shape in a short period of time, so as to manufacture the piezoelectric resonator, by a simple step of irradiating the arms of the resonator element with laser light.

In yet another aspect of the present invention, a method for manufacturing a piezoelectric resonator including a resonator element having a plate-like base and a plurality of arms extending laterally from the base, the arms being provided with a groove, includes:

irradiating one surface and another surface of a substrate made of a piezoelectric material with laser light and removing a region irradiated with the laser light so as to form the groove having a predetermined cross sectional shape perpendicular to a longitudinal direction of the groove and placed opposite to one another on both surfaces of the substrate;

forming at least one resonator element on the substrate with the groove placed on one surface and another surface of the arms and with part of the resonator element coupled to the substrate; and forming a driving electrode that provides the resonator element with a voltage for driving the piezoelectric resonator.

This makes it possible to accurately form the groove having a desired shape in a short period of time, so as to manufacture the piezoelectric resonator, by a simple step of irradiating the substrate made of a piezoelectric material with laser light.

In yet another aspect of the present invention, the method for manufacturing a piezoelectric resonator further includes, in the step of forming the driving electrode, forming a conductive film on the resonator element; and irradiating the conductive film with laser light while leaving a predetermined pattern shape unirradiated and removing a region of the conductive film irradiated with the laser light so as to wire a driving electrode.

This makes it possible to wire the driving electrode by a simple step of emitting laser light, thereby further increasing efficiency.

In yet another aspect of the present invention, a method for manufacturing a piezoelectric resonator including a resonator element having a plate-like base and a plurality of arms extending laterally from the base, the arms being provided with a groove, includes:

forming at least one resonator element on a substrate made of a piezoelectric material with part of the resonator element coupled to the substrate;

forming a conductive film on the resonator element;

irradiating one surface and another surface of the arms with laser light on the conductive film and removing a region irradiated with the laser light so as to form the groove having a predetermined cross sectional shape perpendicular to a longitudinal direction of the groove; and removing the conductive film of the resonator element on which the groove is formed while leaving a predetermined pattern shape and wiring a driving electrode that provides a voltage for driving the piezoelectric resonator.

Since the groove is formed after the conductive film is formed, the conductive film provided in a region in which the groove is to be formed is removed while forming the groove in the step of irradiating laser light, thereby increasing efficiency in the step of wiring an electrode.

In yet another aspect of the present invention, a method for manufacturing a piezoelectric resonator including a resonator element having a plate-like base and a plurality of arms extending laterally from the base, the arms being provided with a groove, includes:

forming at least one resonator element on a substrate made of a piezoelectric material with part of the resonator element coupled to the substrate;

forming a conductive film on the resonator element;

removing the conductive film while leaving a predetermined pattern shape and wiring a driving electrode that provides a voltage for driving the piezoelectric resonator; and irradiating one surface and another surface of the arms of the resonator element to which the driving electrode is wired with laser light and removing a region irradiated with the laser light so as to form the groove having a predetermined cross sectional shape perpendicular to a longitudinal direction of the groove.

Since the groove is formed after the conductive film provided in a region of the resonator element in which the groove is to be formed is removed, no scattering objects due to laser light irradiation of the conductive film are created, thereby preventing a short circuit of wiring caused by such scattering objects of the conductive film.

In yet another aspect of the present invention, in the step of wiring a driving electrode, the conductive film is irradiated with laser light while leaving the predetermined pattern shape unirradiated and a region of the conductive film irradiated with the laser light is removed, so as to wire the driving electrode.

This makes it possible to continuously carry out the step of emitting laser light and the step of wiring an electrode, thereby increasing efficiency in the manufacturing process.

In yet another aspect of the present invention, in the step of forming a resonator element, a substrate made of the piezoelectric material is irradiated with laser light along an outer shape of the resonator element and a region irradiated with the laser light is removed, so as to form the resonator element.

This makes it possible to accurately form the resonator element having a desired shape in a short period of time by a simple step of emitting laser light.

In yet another aspect of the present invention, the predetermined shape is a shape having substantially fixed groove dimensions of the arms in a width direction.

In yet another aspect of the present invention, the laser light is emitted in a predetermined shape with a mask pattern.

This makes it possible to emit laser light in a desired shape.

In yet another aspect of the present invention, the laser light is emitted by being collected by a light collecting element.

This makes it possible to emit laser light at an intensity strong enough to carry out removal processing of a processed material by collecting laser light whose intensity is not strong enough to carry out the removal processing. This way a micro structure can be formed by reducing the area of laser light irradiation, as well as lowering energy consumption. Thus, in the step of forming a resonator element, the arrangement density of a plurality of resonator elements can be increased.

In yet another aspect of the present invention, the laser light is emitted in a predetermined shape with a mask pattern and imaged by a light collecting element.

In yet another aspect of the present invention, the light collecting element is a convex lens.

In yet another aspect of the present invention, the laser light is emitted with equalized intensities in an irradiated area by a diffractive optical element.

This makes it possible to evenly remove the region irradiated with laser light, thereby making the bottom of the groove flat and smooth.

In yet another aspect of the present invention, the diffractive optical element is a phase grating.

In yet another aspect of the present invention, the piezoelectric material is crystal, and the laser light is $F_2$ excimer laser light.

In yet another aspect of the present invention, the piezoelectric material is crystal, and the laser light is ultrashort pulse laser light.

Here, ultrashort pulse laser means laser light having a pulse width is in a femtosecond ($10^{-15}$ second) range.

This enables the removal processing by the principle of multiphoton absorption by irradiating crystal with ultrashort pulse laser light.

BRIEF DESCRIPTION OF THE DRAWINGS

FIGS. 3A and 3B are sectional views schematically illustrating a step for emitting laser light according to the first embodiment.

FIGS. 4A and 4B are sectional views schematically illustrating a step for forming an electrode according to the first embodiment.

FIG. 5 is a view showing steps of a second manufacturing method according to a second embodiment.

FIGS. 6A and 6B are views illustrating a step for emitting laser light according to the second embodiment.

FIGS. 7A-7C are views illustrating a step for forming a resonator element according to the second embodiment.

FIG. 8 is a view showing steps of a third manufacturing method according to a fifth embodiment.

FIGS. 9A-9C are sectional views schematically illustrating a step for forming a conductive film and a step for emitting laser light according to the fifth embodiment.

FIG. 12 is a plan view schematically showing one surface of a piezoelectric resonator according to the first embodiment of the present invention.

FIG. 13 is a plan view schematically showing the other surface of the piezoelectric resonator according to the first embodiment of the present invention.

FIG. 14 is a sectional view of the piezoelectric resonator along line A-A shown in FIG. 12.

FIG. 15 is a plan view schematically showing one surface of a piezoelectric resonator according to the third embodiment of the present invention.

FIG. 16 is a plan view schematically showing the other surface of the piezoelectric resonator according to the third embodiment of the present invention.

DETAILED DESCRIPTION

Figure 1:
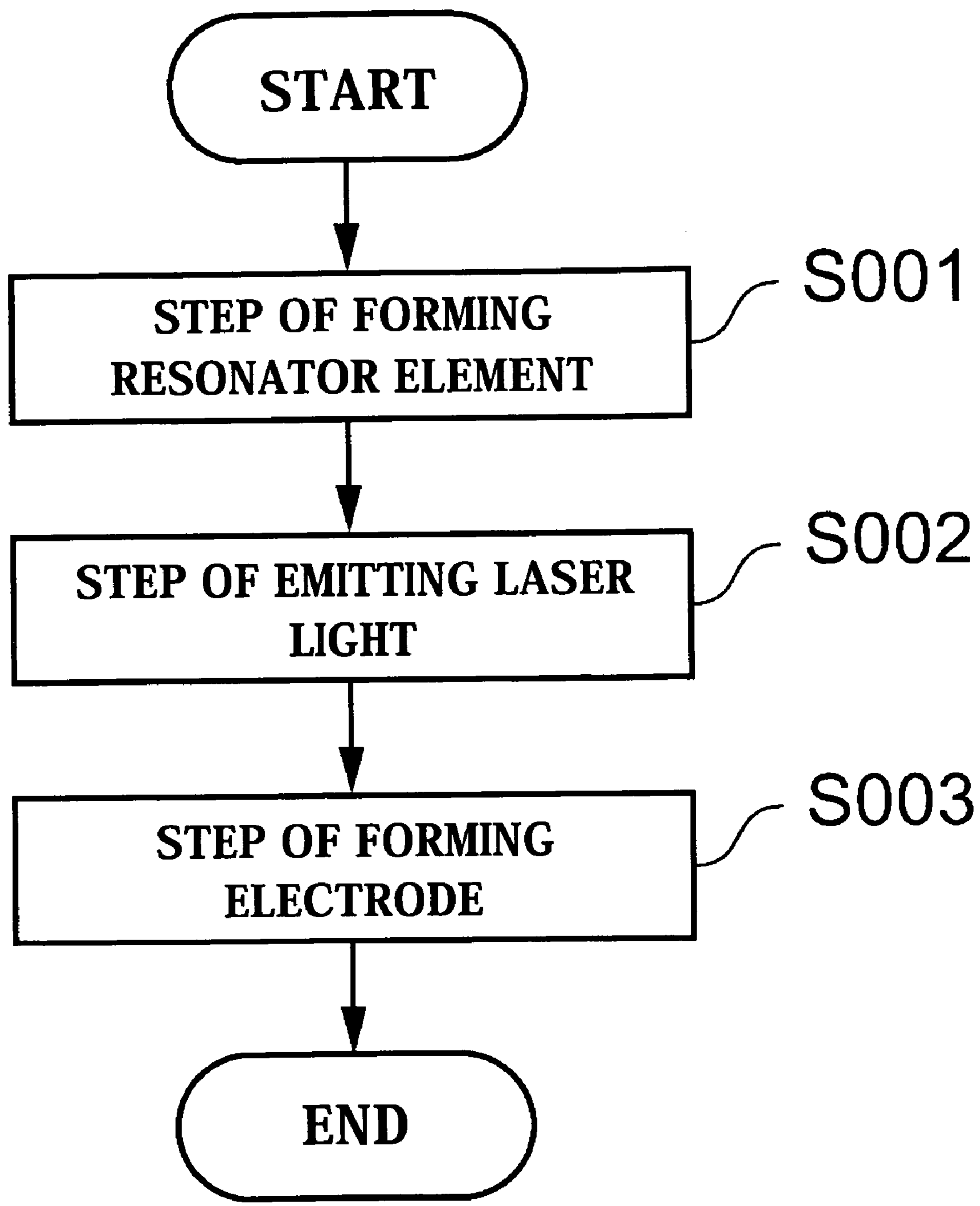
FIG. 1 is a view showing steps of a first manufacturing method according to a first embodiment.

Preferred embodiments of the present invention will be described with reference to the accompanying drawings.

First Embodiment

Referring to FIGS. 1 through 4 and 12 through 14, a first embodiment of the present invention will now be described.

FIG. 12 is a plan view schematically showing one surface of a piezoelectric resonator of the first embodiment. FIG. 13 is a plan view schematically showing the other surface of the piezoelectric resonator. FIG. 14 is a sectional view of the piezoelectric resonator along line A-A shown in FIG. 12.

A piezoelectric resonator 1 according to the first embodiment is made of a crystal piezoelectric material, and as shown in FIGS. 12 and 13, includes a resonator element 5 having a plate-like base 2, and two arms 3, 4 extending laterally from the base 2 in the same direction in parallel with each other. In one surface 6 and the other (opposite) surface 7 of the arms 3, 4, grooves 8 through 11 extending longitudinally are provided. On the resonator element 5, a first driving electrode 12 and a second driving electrode 13 that give a voltage for driving the piezoelectric resonator 1 are provided. The first driving electrode 12 and the second driving electrode 13 are wired, as shown in FIG. 14, on a side 15 and a bottom 16 of the grooves 8 through 11 and a side 17 of the arms 3, 4 astride the one surface 6 and the other surface 7 of the resonator element 5. On the base 2 side of the driving electrodes 12, 13, ends 18, 19 are placed on the one surface 6 and the other surface 7, respectively, of the base 2. Here, the driving electrodes 12, 13 are hatched in FIGS. 12 and 13.

The wiring of the first driving electrode 12 and the second driving electrode 13 of the piezoelectric resonator 1 will now be described.

As shown in FIGS. 12 and 13, the first driving electrode 12 and the second driving electrode 13 are wired in the same manner both on the front and back of the piezoelectric resonator 1. More specifically, a pair of electrode sections 12*a*, 12*b* placed opposite to one another on the front and back of the arm 3 are conductively connected to a pair of electrode sections 12*c*, 12*d* placed opposite to one another on both sides of the arm 4. Moreover, both pairs are conductively connected to the end 18 of the base 2, making up the first driving electrode 12. Similarly, a pair of electrode sections 13*a*, 13*b* placed opposite to one another on the front and back of the arm 4 are conductively connected to a pair of electrode sections 13*c*, 13*d* placed opposite to one another on both sides of the arm 3. Moreover, both pairs are conductively connected to the end 19 of the base 2, making up the second driving electrode 13.

The shape of the grooves 8 through 11, which are provided on the arms 3, 4 of the resonator element 5, and the configuration of the first driving electrode 12 and the second driving electrode 13 will now be described.

As shown in FIG. 14, the grooves 8 through 11 have a specific shape, that is to say, the side 15 of the grooves 8 through 11 extends from both ends of the bottom 16 substantially vertically in the cross section perpendicular to the longitudinal direction of the grooves 8 through 11. In other words, the grooves 8 through 11 are formed so that the dimension of the arms 3, 4 in the width direction is substantially fixed. The first driving electrode 12 is provided on the side 15 and the bottom 16 of the grooves 8, 9 of the arm 3 and on the side 17 of the arm 4. The second driving electrode 13 is provided on the side 15 and the bottom 16 of the grooves 10, 11 of the arm 4 and on the side 17 of the arm 3.

A method for manufacturing the piezoelectric resonator 1 according to the first embodiment will now be described.

The first embodiment provides a first method for manufacturing the piezoelectric resonator 1. FIG. 1 is a view showing steps of the first manufacturing method according to the first embodiment. Referring to FIG. 1, the first manufacturing method includes step S001 for forming a resonator element that forms the resonator element 5, step S002 for emitting laser light that forms the grooves 8 through 11 on the arms 3, 4 of the resonator element 5, and step S003 for forming an electrode that forms the first driving electrode 12 and the second driving electrode 13 on the resonator element 5, in this order.

FIG. 2 is a view illustrating step S001 for forming a resonator element according to the first embodiment.

Figure 2A:
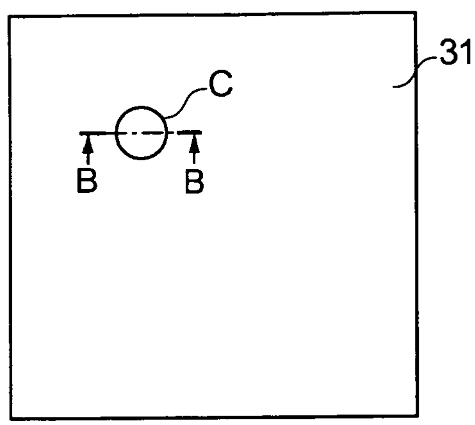
FIGS. 2A-2D are views illustrating a step for forming a resonator element according to the first embodiment.
Figure 2B:
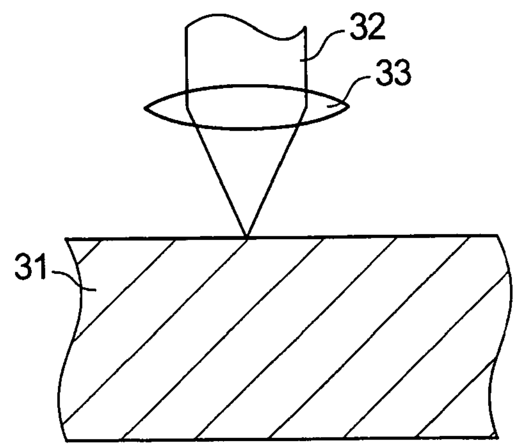
Figure 2C:
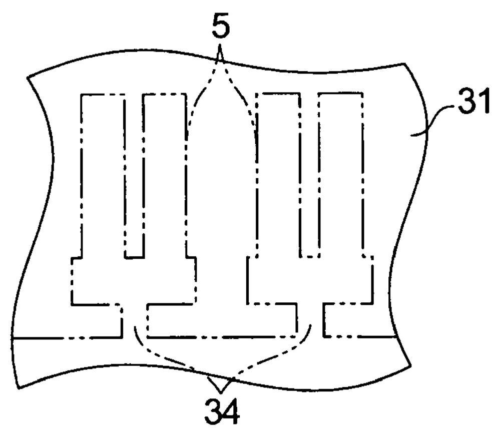
Figure 2D:
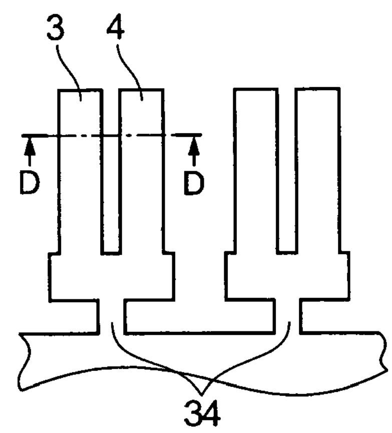

FIG. 2A is a plan view showing a substrate 31 made of crystal that is a base made of a piezoelectric material. FIG. 2B is a sectional view along line B-B shown in FIG. 2A. FIG. 2C is an enlarged plan view of the region marked with "C" of the substrate 31 shown in FIG. 2A. FIG. 2D shows the resonator element 5 coupled to the substrate 31.

First, in step S001 for forming a resonator element, the substrate 31 is irradiated with laser light 32 that is $F_2$ excimer laser light by using a convex lens 33 for collecting (focusing) light as shown in FIG. 2B. The laser light 32 is emitted along the dotted line shown in FIG. 2C. The region irradiated with the laser light is then removed, thereby forming the resonator element 5 coupled to the substrate 31 via a coupling section 34. Thus as shown in FIG. 2D, multiple resonator elements 5 are provided and are coupled to the substrate 31 via coupling sections 34.

Here, the depth of processing by laser light irradiation is determined by the irradiation intensity and shot count, i.e. the number of irradiation times per unit time, of the laser light 32. It is designed that the laser light 32 is emitted for the shot count that is necessary for penetrating the substrate 31 at each point.

FIG. 3 is a sectional view schematically showing step S002 for emitting laser light according to the first embodiment.

FIG. 3A is a sectional view along line D-D shown in FIG. 2D. FIG. 3B shows the grooves 8 through 11 formed on the arms 3, 4.

In step S002 for emitting laser light, as shown in FIG. 3A, the one surface 6 and the other surface 7 of the arms 3, 4 of the resonator element 5 formed in step S001 for forming a resonator element are irradiated with the laser light 32 that is $F_2$ excimer laser light. The shape of irradiation of the laser light 32 is rectangular and is set by a mask pattern 36. Through the convex lens 33 an image is formed on the surface of the arm 3 (or 4). The region irradiated with the laser light is then removed, thereby forming the grooves 8 through 11 as shown in FIG. 3B. More specifically, after forming the grooves 8, 10 by irradiating the one surface 6 of the arms 3, 4 with the laser light 32, the substrate 31 is inverted and re-set, and then the grooves 9, 11 are formed by irradiating the other surface 7 of the arms 3, 4 with the laser light 32. The shot count of the laser light 32 is determined by the necessary depth of the grooves.

FIG. 4 is a sectional view schematically showing step S003 for forming an electrode according to the first embodiment.

In step S003 for forming an electrode, as shown in FIG. 4A, a film (conductive film) 38 made of conductive metal such as Au, Ag is formed by sputtering, for example.

Here, it is preferable that the film 38 made of metal such as Au, Ag is formed on the resonator element 5 with a Cr film (not shown) that is highly adhesive to Au, Ag, and crystal therebetween. Then as shown in FIG. 4B, the film 38 is irradiated with the laser light 32 that is $F_2$ excimer laser light collected by the convex lens 33 so that a desired wiring shape (predetermined pattern shape) is left unirradiated. The region irradiated with the laser light is then removed, and the first driving electrode 12 and the second driving electrode 13 are wired. After this step, the resonator element 5 is separated from the coupling section 34 that is coupled to the substrate 31, which completes the piezoelectric resonator 1 shown in FIGS. 12, 13, and 14.

As described above, it is possible to form the grooves 8 through 11 having a micro structure and a desired cross sectional shape in a short period of time without a number of complicated steps employing dry etching in forming the grooves 8 through 11 on the arms 3, 4 of the resonator element 5 in step S002 for emitting laser light. While removal processing using the laser light 32 is employed in step S001 for forming a resonator element and for wiring in step S003 for forming an electrode according to the first manufacturing method, photolithography and etching may be employed instead.

Since step S001 for forming a resonator element comes before step S002 for emitting laser light, in which the grooves are formed, it is possible to efficiently carry out step S002 for emitting laser light following step S001 for forming a resonator element.

Also, while the laser light 32 is collected by the convex lens 33 and emitted in step S001 for forming a resonator element according to the first manufacturing method, it is also possible to carry out step S002 for emitting laser light following step S001 for forming a resonator element by emitting the laser light 32 through the mask pattern 36 and the convex lens 33 to produce an image. More specifically, the width to which the laser light 32 is emitted is adjusted to the width of the grooves 8 through 11, and the resonator element and the grooves are formed with a common image that is produced through the common mask pattern 36 and convex lens 33. In this case, the irradiation intensity of the laser light 32 is equal for forming both the resonator element and the grooves. By changing the shot count or irradiation time of the laser light 32, it is possible to obtain individual required depths. It is, therefore, possible to carry out step S001 for forming a resonator element and step S002 for emitting laser light, in which the grooves are formed, in a common laser light irradiation step, thereby further increasing efficiency in the manufacturing process.

Second Embodiment

Referring now to FIGS. 4 through 7 and 12 through 14, a second embodiment of the present invention will be described. The second embodiment provides a second method for manufacturing the piezoelectric resonator 1. Since the piezoelectric resonator 1 manufactured by the manufacturing method of the second embodiment has the same structure and appearance as those of the piezoelectric resonator 1 of the first embodiment, their descriptions will be omitted here.

FIG. 5 is a view showing steps of the second manufacturing method according to the second embodiment.

Referring to FIG. 5, the second manufacturing method includes step S004 for emitting laser light that forms the grooves 8 through 11 on the substrate 31 made of crystal, step S005 for forming a resonator element that forms the resonator element 5, and step S006 for forming an electrode that forms the first driving electrode 12 and the second driving electrode 13 on the resonator element 5, in this order.

FIG. 6 is a view showing step S004 for emitting laser light according to the second embodiment.

FIG. 6A is a plan view of the substrate 31 made of crystal that is a base made of a piezoelectric material. FIG. 6B is a sectional view along line E-E shown in FIG. 6A.

First, in step S004 for emitting laser light, the one surface 6 and the other surface 7 of the substrate 31 is irradiated with the laser light 32 that is $F_2$ excimer laser light and whose irradiation shape is made rectangular by the mask pattern 36 with an image that is produced through the convex lens 33. Then the region irradiated with the laser light is removed so as to form the grooves 8 through 11 as shown in FIG. 6B.

FIG. 7 is a view illustrating step S005 for forming a resonator element according to the second embodiment.

FIG. 7A is a sectional view of the substrate 31, on which the grooves 8 through 11 are provided, along line E-E shown in FIG. 6A. FIG. 7B is an enlarged view of the region marked with "F" of the substrate 31, on which the grooves 8 through 11 are provided, shown in FIG. 6A. FIG. 7C is a plan view showing the resonator element 5 coupled to the substrate 31.

In step S005 for forming a resonator element, as shown in FIG. 7A, the substrate 31, on which the grooves 8 through 11 are provided, is irradiated with the laser light 32 that is $F_2$ excimer laser light by using the convex lens 33 for collecting light. The laser light 32 is emitted along the dotted line shown in FIG. 7B. The region irradiated with the laser light is then removed, thereby forming the resonator element 5 coupled to the substrate 31 via the coupling section 34. Thus as shown in FIG. 7C, multiple resonator elements 5 are provided and are coupled to the substrate 31 via coupling sections 34.

In step S006 for forming an electrode, in the same manner as the first embodiment and as shown in FIG. 4A, a film (conductive film) 38 made of conductive metal such as Au and Ag is formed by sputtering, for example. Here, it is preferable that the film 38 made of metal such as Au, Ag is formed on the resonator element 5 with a Cr film (not shown) that is highly adhesive to Au, Ag, and crystal therebetween. Then as shown in FIG. 4B, the film 38 is irradiated with the laser light 32 that is $F_2$ excimer laser light collected by the convex lens 33 with a desired wiring shape left unirradiated. The region irradiated with the laser light is then removed, and the first driving electrode 12 and the second driving electrode 13 are wired.

After this step, the resonator element 5 is separated from the coupling section 34 that is coupled to the substrate 31, which completes the piezoelectric resonator 1 shown in FIGS. 12, 13, and 14.

As described above, it is possible to form the grooves 8 through 11 having a micro structure and a desired cross sectional shape in a short period of time without a number of complicated steps employing dry etching in forming the grooves 8 through 11 on the substrate 31 in step S004 for emitting laser light. While removal processing using the laser light 32 is employed in step S005 for forming a resonator element and for wiring in step S006 for forming an electrode according to the second manufacturing method, photolithography and etching may be employed instead.

Since step S004 for emitting laser light, in which the grooves are formed, comes before step S005 for forming a resonator element, it is possible to efficiently carry out step S005 for forming a resonator element following step S004 for emitting laser light.

Also, while the laser light 32 is collected by the convex lens 33 and emitted in step S005 for forming a resonator element according to the second manufacturing method, it is also possible to carry out step S005 for forming a resonator element following step S004 for emitting laser light by emitting the laser light 32 through the mask pattern 36 and the convex lens 33 to produce an image. More specifically, the width to which the laser light 32 is emitted is adjusted to the width of the grooves 8 through 11, and the resonator element and the grooves are formed with a common image that is produced through the common mask pattern 36 and convex lens 33. In this case, the irradiation intensity of the laser light 32 is equal for forming both the resonator element and the grooves. By changing the shot count or irradiation time of the laser light 32, it is possible to obtain individual required depths. It is, therefore, possible to carry out step S005 for forming a resonator element and step S004 for emitting laser light, in which the grooves are formed, in a common laser light irradiation step, thereby further increasing efficiency in the manufacturing process.

Third Embodiment

Referring now to FIGS. 1 through 4 and 15 through 17, a third embodiment of the present invention will be described.

Figure 17:
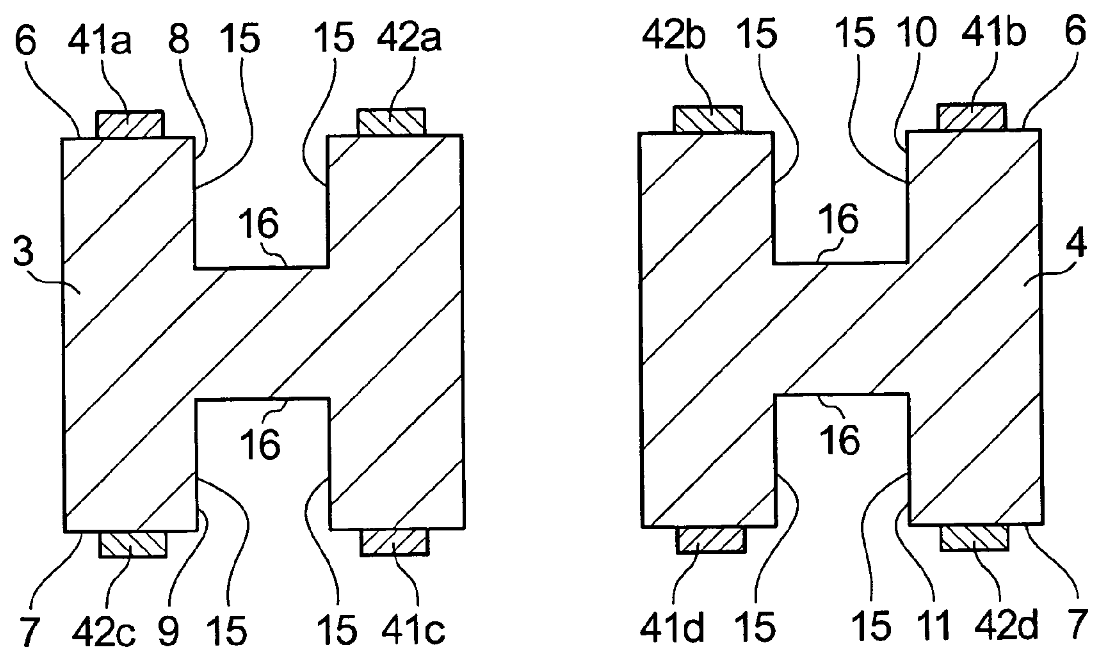
FIG. 17 is a sectional view of the piezoelectric resonator along line H-H shown in FIG. 15.

FIG. 15 is a plan view schematically showing one surface of a piezoelectric resonator of the third embodiment. FIG. 16 is a plan view schematically showing the other surface of the piezoelectric resonator. FIG. 17 is a sectional view of the piezoelectric resonator along line H-H shown in FIG. 15.

A piezoelectric resonator 40 according to the third embodiment is made of a crystal piezoelectric material, and as shown in FIGS. 15 and 16, includes the resonator element 5 having the plate like base 2, and the two arms 3, 4 extending laterally from the base 2 in the same direction in parallel with each other. In the one surface 6 and the other surface 7 of the arms 3, 4, the grooves 8 through 11 extending longitudinally are provided. On the resonator element 5, a first driving electrode 41 and a second driving electrode 42 that give a voltage for driving the piezoelectric resonator are provided. The first driving electrode 41 and the second driving electrode 42 are wired around the grooves 8 through 11 astride the one surface 6 and the other surface 7 of the resonator element 5. The first driving electrode 41 and the second driving electrode 42 have ends 43, 44, respectively, on the one surface 6 of the base 2.

The wiring of the first driving electrode 41 and the second driving electrode 42 of the piezoelectric resonator 40 will now be described.

As for the first driving electrode 41 as shown in FIGS. 15 and 16, an electrode section 41*a* provided on the one surface 6 of the arm 3, an electrode section 41*b* provided on the one surface 6 of the arm 4, an electrode section 41*c* provided on the other surface 7 of the arm 3, and an electrode section 41*d* provided on the other surface 7 of the arm 4 are conductively connected to each other. Moreover, the first driving electrode 41 is conductively connected to the end 43 provided on the one surface 6 of the base 2. As for the second driving electrode 42, an electrode section 42*a* provided on the one surface 6 of the arm 3, an electrode section 42*b* provided on the one surface 6 of the arm 4, an electrode section 42*c* provided on the other surface 7 of the arm 3, and an electrode section 42*d* provided on the other surface 7 of the arm 4 are conductively connected to each other. Moreover, the second driving electrode 42 is conductively connected to the end 44 provided on the one surface 6 of the base 2. Here, the driving electrodes 41, 42 are hatched in FIGS. 15 and 16.

The shape of the grooves 8 through 11, which are provided on the arms 3, 4 of the resonator element 5, and the configuration of the first driving electrode 41 and the second driving electrode 42 will now be described.

As shown in FIG. 17, the grooves 8 through 11 have a specific shape, that is to say, the side 15 of the grooves 8 through 11 extends from both ends of the bottom 16 substantially vertically in the cross section perpendicular to the longitudinal direction of the grooves 8 through 11. In other words, the grooves 8 through 11 are formed so that the dimension of the arms 3, 4 in the width direction is substantially fixed. The first driving electrode 41 and the second driving electrode 42 are formed on the one surface 6 and the other surface 7 of the arms 3, 4 in a way that, out of the electrode sections 41*a* through 41*d* of the first driving electrode 41 and the electrode sections 42*a* through 42*d* of the second driving electrode 42, each pair of the electrode sections 41*a* and 42*c*, 41*b* and 42*d*, 41*c* and 42*a*, and 41*d* and 42*b* is placed opposite to one another.

A method for manufacturing the piezoelectric resonator 40 according to the third embodiment will now be described. The third embodiment provides a method for manufacturing the piezoelectric resonator 40 using the first manufacturing method according to the first embodiment.

The method for manufacturing the piezoelectric resonator 40 according to the third embodiment is similar to the first manufacturing method according to the first embodiment, and as shown in FIG. 1, includes step S001 for forming a resonator element that forms the resonator element 5, step S002 for emitting laser light that forms the grooves 8 through 11 on the arms 3, 4 of the resonator element 5, and step S003 for forming an electrode that forms the first driving electrode 41 and the second driving electrode 42 on the resonator element 5, in this order.

Each of the steps is similar to that of the first embodiment. Therefore, a detailed description is omitted and points that are different between the two are described below.

Step S001 for forming a resonator element and step S002 for emitting laser light are carried out in the same manner as the first embodiment. In step S003 for forming an electrode, in order to wire the first driving electrode 41 and the second driving electrode 42, the laser light 32 that is $F_2$ excimer laser light is emitted with the wiring shape shown in FIGS. 15 and 16 left unirradiated, thereby removing the region of the film (conductive film) 38 irradiated with the laser light. After this step, the resonator element 5 is separated from the coupling section 34 that is coupled to the substrate 31, which completes the piezoelectric resonator 40 shown in FIGS. 15, 16, and 17.

As described above, it is possible to form the grooves 8 through 11 having a micro structure and a desired cross sectional shape in a short period of time without a number of complicated steps employing dry etching in forming the grooves 8 through 11 on the arms 3, 4 of the resonator element 5 in step S002 for emitting laser light. While the removal processing using the laser light 32 is employed in step S001 for forming a resonator element and for wiring in step S003 for forming an electrode according to the first manufacturing method, photolithography and etching may be employed instead.

Since step S001 for forming a resonator element comes before step S002 for emitting laser light, in which the grooves are formed, it is possible to efficiently carry out step S002 for emitting laser light following step S001 for forming a resonator element.

Also, while the laser light 32 is collected by the convex lens 33 and emitted in step S001 for forming a resonator element according to the first manufacturing method, it is also possible to carry out step S002 for emitting laser light following step S001 for forming a resonator element by emitting the laser light 32 through the mask pattern 36 and the convex lens 33 to produce an image. More specifically, the width to which the laser light 32 is emitted is adjusted to the width of the grooves 8 through 11, and the resonator element and the grooves are formed with a common image that is produced through the common mask pattern 36 and convex lens 33. In this case, the irradiation intensity of the laser light 32 is equal for forming both the resonator element and the grooves. By changing the shot count or irradiation time of the laser light 32, it is possible to obtain individual required depths. It is, therefore, possible to carry out step S001 for forming a resonator element and step S002 for emitting laser light, in which the grooves are formed, in a common laser light irradiation step, thereby further increasing efficiency in the manufacturing process.

Fourth Embodiment

Referring to FIGS. 4 through 7 and 15 through 17, a fourth embodiment of the present invention will now be described. The fourth embodiment provides a method for manufacturing the piezoelectric resonator 40 using the second manufacturing method according to the second embodiment. Since the piezoelectric resonator 40 manufactured by the manufacturing method of the fourth embodiment has the same structure and appearance as those of the piezoelectric resonator 40 of the third embodiment, their descriptions will be omitted here.

The method for manufacturing the piezoelectric resonator 40 according to the fourth embodiment is similar to the second manufacturing method according to the second embodiment, and as shown in FIG. 5, includes step S004 for emitting laser light that forms the grooves 8 through 11 on the substrate 31 made of crystal, step S005 for forming a resonator element that forms the resonator element 5, and step S006 for forming an electrode that forms the first driving electrode 41 and the second driving electrode 42 on the resonator element 5, in this order.

Each of the steps is similar to that of the second embodiment. Therefore, a detailed description is omitted and points that are different between the two are described below.

Step S004 for emitting laser light and step S005 for forming a resonator element are carried out in the same manner as the second embodiment. In step S006 for forming an electrode, in order to wire the first driving electrode 41 and the second driving electrode 42, the laser light 32 that is $F_2$ excimer laser light is emitted with the wiring shape shown in FIGS. 15 and 16 left unirradiated, thereby removing the region of the film (conductive film) 38 irradiated with the laser light. After this step, the resonator element 5 is separated from the coupling section 34 that is coupled to the substrate 31, which completes the piezoelectric resonator 40 shown in FIGS. 15, 16, and 17.

As described above, it is possible to form the grooves 8 through 11 having a micro structure and a desired cross sectional shape in a short period of time without a number of complicated steps employing dry etching in forming the grooves 8 through 11 on the substrate 31 in step S004 for emitting laser light. While the removal processing using the laser light 32 is employed in step S005 for forming a resonator element and for wiring in step S006 for forming an electrode according to the second manufacturing method, photolithography and etching may be employed instead.

Since step S004 for emitting laser light, in which the grooves are formed, comes before step S005 for forming a resonator element, it is possible to efficiently carry out step S005 for forming a resonator element following step S004 for emitting laser light.

Also, while the laser light 32 is collected by the convex lens 33 and emitted in step S005 for forming a resonator element according to the second manufacturing method, it is also possible to carry out step S005 for forming a resonator element following step S004 for emitting laser light by emitting the laser light 32 through the mask pattern 36 and the convex lens 33 to produce an image. More specifically, the width to which the laser light 32 is emitted is adjusted to the width of the grooves 8 through 11, and the resonator element and the grooves are formed with a common image that is produced through the common mask pattern 36 and convex lens 33. In this case, the irradiation intensity of the laser light 32 is equal for forming both the resonator element and the grooves. By changing the shot count or irradiation time of the laser light 32, it is possible to obtain individual required depths. It is, therefore, possible to carry out step S005 for forming a resonator element and step S004 for emitting laser light, in which the grooves are formed, in a common laser light irradiation step, thereby further increasing efficiency in the manufacturing process.

Fifth Embodiment

Referring now to FIGS. 8, 9, 15 through 17, a fifth embodiment of the present invention will be described. The fifth embodiment provides a third method for manufacturing the piezoelectric resonator 40. Since the piezoelectric resonator 40 manufactured by the manufacturing method of the fifth embodiment has the same structure and appearance as those of the piezoelectric resonator 40 of the third embodiment, their descriptions will be omitted here.

FIG. 8 is a view showing steps of the third manufacturing method according to the fifth embodiment.

Referring to FIG. 8, the third manufacturing method includes step S007 for forming a resonator element that forms the resonator element 5, step S008 for forming a conductive film that forms the film (conductive film) 38 having conductivity on the resonator element 5, step S009 for emitting laser light that forms the grooves 8 through 11 on the arms 3, 4 of the resonator element 5, and step S010 for wiring an electrode that wires the first driving electrode 41 and the second driving electrode 42 on the resonator element 5, in this order.

Each step of the third manufacturing method according to the fifth embodiment will now be described.

First, in step S007 for forming a resonator element, in the same manner as step S001 for forming a resonator element according to the first embodiment, multiple resonator elements 5 are provided and are coupled to the substrate 31 via coupling sections 34 as shown in FIG. 2.

FIG. 9 is a sectional view schematically showing step S008 for forming a conductive film and step S009 for emitting laser light according to the fifth embodiment.

FIG. 9A shows step S008 for forming a conductive film and FIGS. 9B and 9C show step S009 for emitting laser light.

In step S008 for forming an electrode, as shown in FIG. 9A, the film 38 made of conductive metal such as Au, Ag is formed by sputtering, for example. Here, it is preferable that the film 38 made of metal such as Au, Ag is formed on the resonator element 5 with a Cr film (not shown) that is highly adhesive to Au, Ag, and crystal therebetween.

Next, in step S009 for emitting laser light, the film 38 formed on the arms 3, 4 is irradiated with the laser light 32 that is $F_2$ excimer laser light coming through the mask pattern 36 and the convex lens 33 to produce an image as shown in FIG. 9B. The region of the film 38 irradiated with the laser light is removed. In the same step, the laser light 32 is emitted to the one surface 6 and the other surface 7 of the arms 3, 4, and the region irradiated with the laser light is removed. Thus the grooves 8 through 11 are formed as shown in FIG. 9C.

Then in step S010 for wiring an electrode as shown in FIG. 9C, the film 38 is irradiated with the laser light 32 that is $F_2$ excimer laser light collected by the convex lens 33 with a desired wiring shape left unirradiated. The region irradiated with the laser light is then removed, and the first driving electrode 41 and the second driving electrode 42 are wired. After this step, the resonator element 5 is separated from the coupling section 34 that is coupled to the substrate 31, which completes the piezoelectric resonator 40 shown in FIGS. 15, 16, and 17.

As described above, it is possible to form the grooves 8 through 11 having a micro structure and a desired cross sectional shape in a short period of time without a number of complicated steps employing dry etching in forming the grooves 8 through 11 on the substrate 31 in step S009 for emitting laser light. While the removal processing using the laser light 32 is employed in step S007 for forming a resonator element and step S010 for wiring an electrode according to the third manufacturing method, photolithography and etching may be employed instead.

Since step S010 for wiring an electrode comes after step S009 for emitting laser light, in which the grooves are formed, it is possible to efficiently carry out step S010 for wiring an electrode following step S009 for emitting laser light.

Also, while the laser light 32 is collected by the convex lens 33 and emitted in step S010 for wiring an electrode, it is also possible to carry out step S010 for wiring an electrode following step S009 for emitting laser light by emitting the laser light 32 through the mask pattern 36 and the convex lens 33 to produce an image. More specifically, the width to which the laser light 32 is emitted is adjusted to the width of the grooves 8 through 11, and the electrodes are wired and the grooves are formed with a common image that is produced through the common mask pattern 36 and convex lens 33. In this case, the irradiation intensity of the laser light 32 is equal for both wiring the electrodes and forming the grooves. By changing the shot count or irradiation time of the laser light 32, it is possible to obtain individual required depths. It is, therefore, possible to carry out step S010 for wiring an electrode and step S009 for emitting laser light, in which the grooves are formed, in a common laser light irradiation step, thereby further increasing efficiency in the manufacturing process.

Sixth Embodiment

Referring now to FIGS. 10, 11, 15 through 17, a sixth embodiment of the present invention will be described. The sixth embodiment provides a fourth method for manufacturing the piezoelectric resonator 40. Since the piezoelectric resonator 40 manufactured by the manufacturing method of the sixth embodiment has the same structure and appearance as those of the piezoelectric resonator 40 of the third embodiment, their descriptions will be omitted here.

Figure 10:
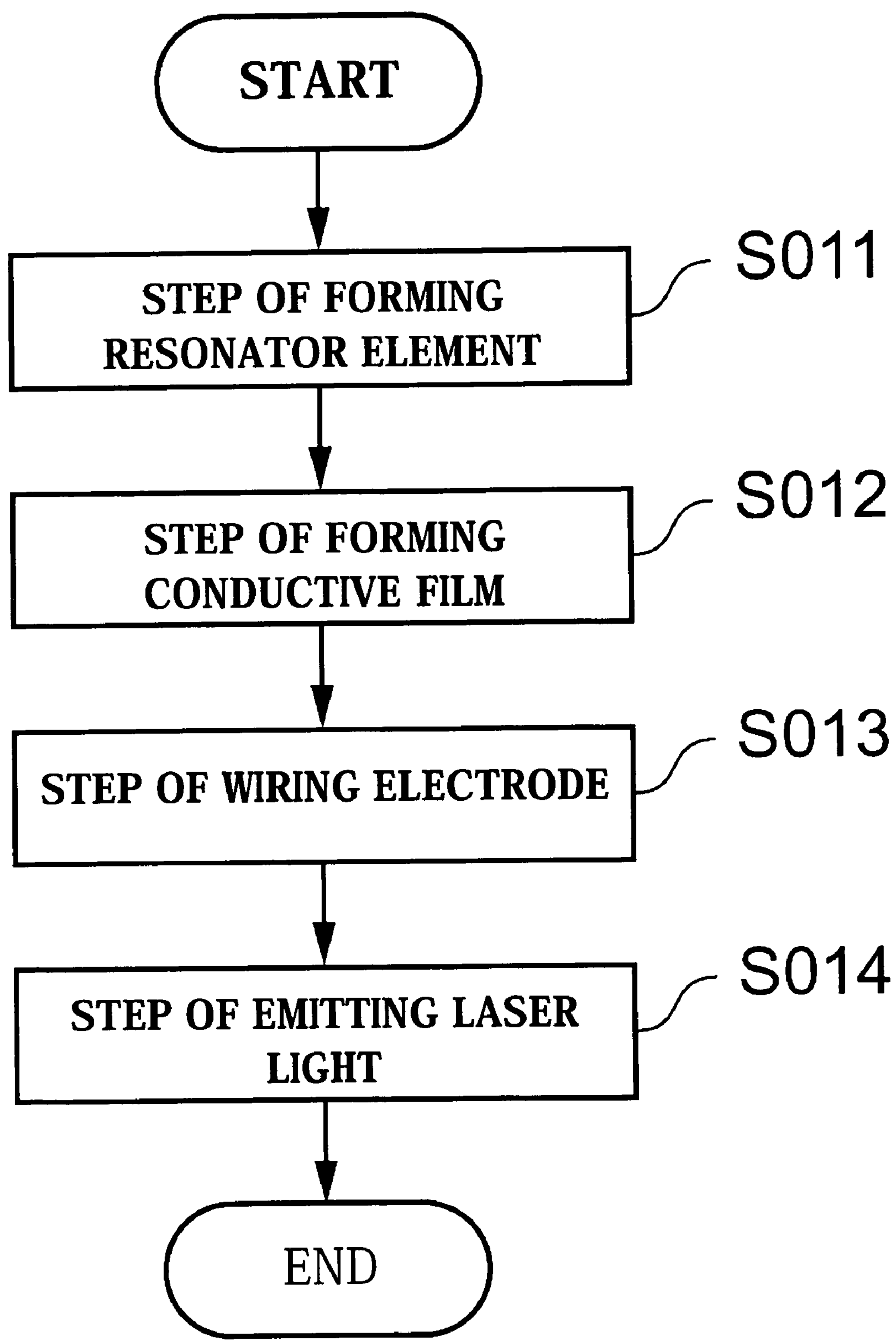
FIG. 10 is a view showing steps of a fourth manufacturing method according to a sixth embodiment.

FIG. 10 is a view showing steps of the fourth manufacturing method according to the sixth embodiment.

Referring to FIG. 10, the fourth manufacturing method includes step S011 for forming a resonator element that forms the resonator element 5, step S012 for forming a conductive film that forms the film (conductive film) 38 having conductivity on the resonator element 5, step S013 for wiring an electrode that wires the first driving electrode 41 and the second driving electrode 42 on the resonator element 5, and step S014 for emitting laser light that forms the grooves 8 through 11 on the arms 3, 4 of the resonator element 5, in this order.

Each step of the fourth manufacturing method according to the sixth embodiment will now be described.

First, in step S011 for forming a resonator element, in the same manner as step S001 for forming a resonator element according to the first embodiment, multiple resonator elements 5 are provided and are coupled to the substrate 31 via coupling sections 34 as shown in FIG. 2.

Figure 11:
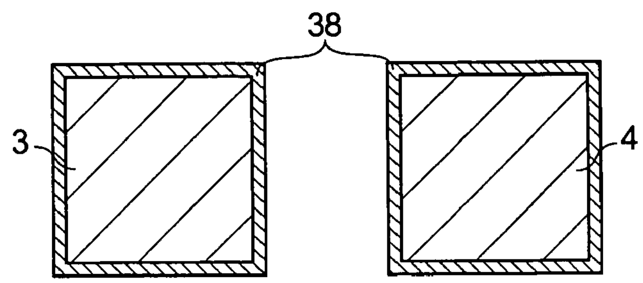
FIGS. 11A-11C are sectional views schematically illustrating a step for forming a conductive film, a step for wiring an electrode, and a step for emitting laser light according to the sixth embodiment.
Figure 11:
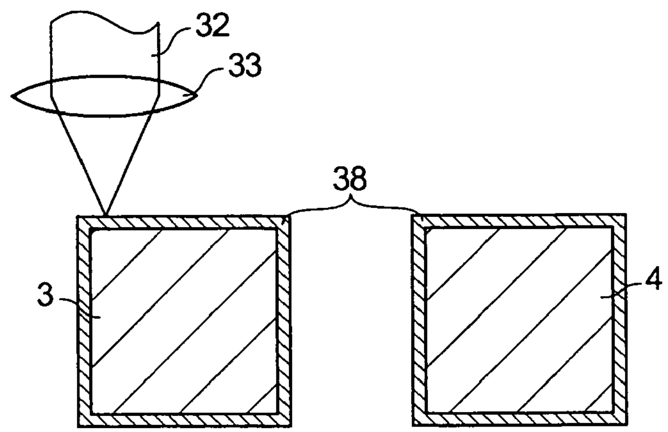
Figure 11:
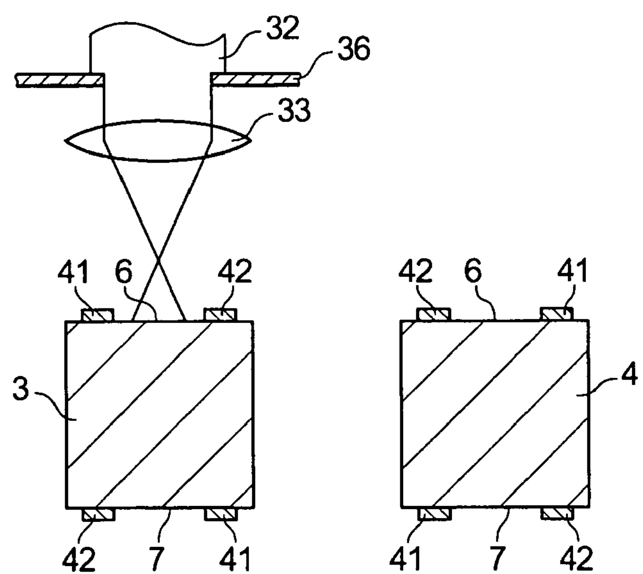

FIG. 11 is a sectional view schematically illustrating step S012 for forming a conductive film, step S013 for wiring an electrode, and step S014 for emitting laser light according to the sixth embodiment.

FIG. 11A shows step S012 for forming a conductive film. FIG. 11B shows step S013 for wiring an electrode. FIG. 11C shows step S014 for emitting laser light.

In step S012 for forming a conductive film, as shown in FIG. 11A, the film 38 made of conductive metal such as Au, Ag is formed by sputtering, for example. Here, it is preferable that the film 38 made of metal such as Au, Ag is formed on the resonator element 5 with a Cr film (not shown) that is highly adhesive to Au, Ag, and crystal therebetween.

Then in step S013 for wiring an electrode as shown in FIG. 11B, the film 38 is irradiated with the laser light 32 that is $F_2$ excimer laser light collected by the convex lens 33 with a desired wiring shape left unirradiated. The region irradiated with the laser light is then removed, and the first driving electrode 41 and the second driving electrode 42 are wired as shown in FIG. 11C.

Next, in step S014 for emitting laser light as shown in FIG. 11C, the one surface 6 and the other surface 7 of the arms 3, 4 are irradiated with the laser light 32 that is $F_2$ excimer laser light coming through the mask pattern 36 and the convex lens 33 to produce an image, and the irradiated region is removed so as to form the grooves 8 through 11 as shown in FIG. 17. After this step, the resonator element 5 is separated from the coupling section 34 that is coupled to the substrate 31, which completes the piezoelectric resonator 40 shown in FIGS. 15, 16, and 17.

As described above, it is possible to form the grooves 8 through 11 having a micro structure and a desired cross sectional shape in a short period of time without a number of complicated steps employing dry etching in forming the grooves 8 through 11 on the substrate 31 in step S014 for emitting laser light. While the removal processing using the laser light 32 is employed in step S011 for forming a resonator element and step S013 for wiring an electrode according to the fourth manufacturing method, photolithography and etching may be employed instead.

Since step S013 for wiring an electrode comes before step S014 for emitting laser light, in which the grooves are formed, it is possible to efficiently carry out step S014 for emitting laser light following step S013 for wiring an electrode.

Also, while the laser light 32 is collected by the convex lens 33 and emitted in step S013 for wiring an electrode, it is also possible to carry out step S014 for emitting laser light following step S013 for wiring an electrode by emitting the laser light 32 through the mask pattern 36 and the convex lens 33 to produce an image. More specifically, the width to which the laser light 32 is emitted is adjusted to the width of the grooves 8 through 11, and the electrodes are wired and the grooves are formed with a common image that is produced through the common mask pattern 36 and convex lens 33. In this case, the irradiation intensity of the laser light 32 is equal for both wiring the electrodes and forming the grooves. By changing the shot count or irradiation time of the laser light 32, it is possible to obtain individual required depths. It is, therefore, possible to carry out step S013 for wiring an electrode and step S014 for emitting laser light, in which the grooves are formed, in a common laser light irradiation step, thereby furthers increasing efficiency in the manufacturing process.

Embodiments of the present invention are not limited to the above-mentioned embodiments, and the following modifications can be also applied.

First Modification

While the convex lens 33 is used as a light collecting element for collecting the laser light 32 and producing an image in the first through sixth embodiments, it is not intended as a limitation. For example, a concave mirror can be used instead. If the laser light 32 has an intensity strong enough to carry out the removal processing of a processed material without collecting light and producing an image, a light collecting element is not needed. However, the light collecting element is preferably used for lowering power consumption, since it enables collecting light and producing an image even if the laser light 32 does not have an intensity strong enough to carry out the removal processing of a processed material.

Second Modification

The laser light 32 is emitted by producing an image using the mask pattern 36 and the convex lens 33 in the first through sixth embodiments. Furthermore, the intensity of the light may be equalized in an entire irradiated area by using a phase photon that is a diffractive optical element. In this case, since a processed material is removed at once on an entire irradiated area, it is possible to make the surface flat and smooth after the removal.

Third Modification

While $F_2$ excimer laser light is used as the laser light 32 in the first through sixth embodiments, it is possible to carry out removal processing by multiphoton absorption using ultrashort pulse laser light having a pulse width is in a femtosecond range.

Fourth Modification

Although the step for forming a resonator element is separated from the step for emitting laser light in the first through fourth embodiments, the two steps may be carried out in a single step.

Fifth Modification

Although the step for emitting laser light is separated from the step for wiring an electrode in the fifth and sixth embodiments, the two steps may be carried out in a single step.

Sixth Modification

While a base made of crystal is used as the base made of a piezoelectric material in the first through sixth embodiments, a base made of lithium tantalate, lithium niobate, langasite crystal, etc., which are piezoelectric materials, may be also used instead.

In view of the above-mentioned embodiments and modifications, it can be appreciated that the following is provided.

A method for manufacturing a piezoelectric resonator including a resonator element having a plate-like base and a plurality of arms extending laterally from the base, the arms being provided with a groove, includes:

irradiating a substrate made of the piezoelectric material with laser light along the outer shape of the resonator element, removing a region irradiated with the laser light so as to form one or more resonator element with part of the resonator element coupled to the substrate; and emitting laser light for irradiating portions of the resonator element to be the arms with laser light and for removing a region irradiated with the laser light so as to form the groove having a predetermined cross sectional shape perpendicular to a longitudinal direction of the groove.

The order of the formation of the resonator element and the groove can be reversed. The resonator element and the groove can be formed alternatively.

In the step of emitting laser light, by changing the shot count or irradiation time of the laser light for forming the resonator element and forming the groove, it is possible to form the resonator element and the groove without changing the intensity and optical system, etc., of the laser light.

This makes it possible to form the resonator element and the groove in a single step without complicated control, thereby increasing efficiency in the step of emitting laser light.

A method for manufacturing a piezoelectric resonator including a resonator element having a plate-like base and a plurality of arms extending laterally from the base, the arms being provided with a groove, includes:

forming a resonator element for forming at least one of the resonator element on a substrate made of a piezoelectric material with part of the resonator element coupled to the substrate;

forming a conductive film for forming a conductive film on the resonator element; and emitting laser light for irradiating the conductive film with laser light with the predetermined pattern shape left unirradiated and for removing a region of the conductive film irradiated with the laser light so as to wire a driving electrode, and also irradiating one surface and another surface of the arms of the resonator element with laser light and removing a region irradiated with the laser light so as to form the groove having a predetermined cross sectional shape perpendicular to the longitudinal direction of the groove.

The order of the wiring of the driving electrode and the forming the groove in the step of emitting laser light can be reversed. The wiring of the driving electrode and the forming the groove can be carried out alternatively.

In the step of emitting laser light, by changing the shot count or irradiation time of the laser light for wiring of the driving electrode and forming the groove, it is possible to wire the driving electrode and form the groove without changing the intensity and optical system, etc., of the laser light.

This makes it possible to wire the driving electrode and form the groove in a single step without complicated control, thereby increasing efficiency in the step of emitting laser light.

What is claimed is:

1. A method for manufacturing a crystal piezoelectric resonator including a crystal resonator element having a plate-like base and two arms extending substantially parallel to one another and substantially perpendicular to the base, the method comprising:

irradiating a first surface of the arms with F2 excimer laser light;

irradiating a second surface of the arms with F2 excimer laser light, the second surface being formed on an opposite side of the arms from the first surface;

removing a region irradiated with the F2 excimer laser light to form a first groove in the first surface, the first groove having a predetermined cross sectional shape perpendicular to a longitudinal direction of the first groove and including a length extending along a length of each arm and a width extending along a width of each arm, the length of each first groove extending substantially parallel to a first groove of an adjacent arm and substantially perpendicular to the base; and removing a region irradiated with the F2 excimer laser light to form a second groove in the second surface having a length extending along a length of each arm and a width extending along a width of each arm, the length of each second groove extending substantially parallel to a second groove of an adjacent arm, substantially parallel to the first groove, and substantially perpendicular to the base, the second groove having a predetermined cross sectional shape perpendicular to a longitudinal direction of the second groove and cooperating with the first groove to provide each arm with a substantially H-shaped cross section, the second groove being formed on an opposite side of the arms from the first groove and being coaxially aligned with the first groove.

2. The method for manufacturing a piezoelectric resonator according to claim 1, wherein:

the F2 excimer laser light is emitted with equalized intensities in an irradiated area by a diffractive optical element.

3. The method for manufacturing a piezoelectric resonator according to claim 2, wherein:

the diffractive optical element comprises a phase grating.

* * * * *